United States Patent
Roh et al.

(10) Patent No.: US 10,539,874 B2
(45) Date of Patent: Jan. 21, 2020

(54) COMPOSITION FOR FORMING ORGANIC ANTI-REFLECTIVE COATING LAYER SUITABLE FOR NEGATIVE TONE DEVELOPMENT

(71) Applicant: DONGJIN SEMICHEM CO., LTD., Incheon (KR)

(72) Inventors: Hyo Jung Roh, Hwaseong-si (KR); Ji Hyun Kim, Hwaseong-si (KR); Seung Jin Kim, Hwaseong-si (KR); Hyun Jin Kim, Hwaseong-si (KR)

(73) Assignee: DONGJIN SEMICHEM CO., LTD., Incheon (KR)

( * ) Notice: Subject to any disclaimer, the term of this patent is extended or adjusted under 35 U.S.C. 154(b) by 0 days.

(21) Appl. No.: 15/609,471

(22) Filed: May 31, 2017

(65) Prior Publication Data

US 2017/0351178 A1    Dec. 7, 2017

(30) Foreign Application Priority Data

Jun. 1, 2016   (KR) ................. 10-2016-0067944

(51) Int. Cl.
*C09D 5/00*        (2006.01)
*G02B 1/111*       (2015.01)
(Continued)

(52) U.S. Cl.
CPC ........... *G03F 7/091* (2013.01); *B05D 3/0272* (2013.01); *B05D 5/00* (2013.01); *C09D 5/006* (2013.01);
(Continued)

(58) Field of Classification Search
CPC .......... G03F 7/091; C09D 5/006; G02B 1/111
See application file for complete search history.

(56) References Cited

U.S. PATENT DOCUMENTS

| 2012/0164338 A1* | 6/2012 | Roh ................. G03F 7/091 427/385.5 |
| 2016/0147152 A1* | 5/2016 | Fujitani .............. G03F 7/11 438/695 |

FOREIGN PATENT DOCUMENTS

KR      20110028763      3/2011

* cited by examiner

*Primary Examiner* — Elizabeth A Burkhart
(74) *Attorney, Agent, or Firm* — Cantor Colburn LLP

(57) ABSTRACT

Provided is a composition for forming an organic anti-reflective coating layer used in a negative tone development, which not only enhance an adhesion to a photoresist while having a high refractive index and a high etch rate but also improve a pattern profile of undercut etc. The composition an isocyanurate compound containing at least one moiety which is represented by Formula 2; a polymer represented
(Continued)

(a)

(b)

by Formula 3 and an organic solvent for dissolving the above-mentioned components.
[Formula 2]
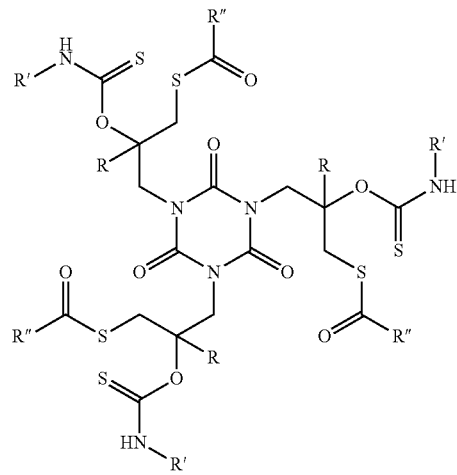
-continued
[Formula 3]
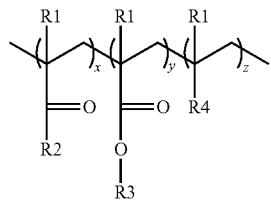
10 Claims, 4 Drawing Sheets
(51) Int. Cl.
   *G03F 7/09* (2006.01)
   *B05D 3/02* (2006.01)
   *B05D 5/00* (2006.01)
   *C09D 125/18* (2006.01)
   *G03F 7/038* (2006.01)
   *G03F 7/16* (2006.01)
(52) U.S. Cl.
   CPC ............ *C09D 125/18* (2013.01); *G02B 1/111* (2013.01); *G03F 7/038* (2013.01); *G03F 7/168* (2013.01)

COMPOSITION FOR FORMING ORGANIC ANTI-REFLECTIVE COATING LAYER SUITABLE FOR NEGATIVE TONE DEVELOPMENT

TECHNICAL FIELD

This invention relates to a composition for forming an organic anti-reflective coating layer used in a negative tone development, and more particularly to a composition for forming an organic anti-reflective coating layer used in a negative tone development, which not only enhance an adhesion to a photoresist while having a high refractive index and a high etch rate but also improve a pattern profile of undercut etc.

BACKGROUND ART

In a photolithography process, ArF(193 nm) excimer laser of short wavelength is used as the exposure light source in order to improve the marginal resolution of the photoresist pattern. However, if the wavelength of the exposure light shortens, optical interference effect by the light reflected from the etching layer of the semi-conductor substrate increases, and the pattern profile or the uniformity of thickness is deteriorated due to undercutting, notching, and so on. To overcome these problems, a bottom anti-reflective coating layer (bottom anti-reflective coatings: BARCs) is conventionally formed between the etching layer and the photoresist layer to absorb the exposure light (reflected light). The bottom anti-reflective coating layer can be classified according to used materials into the inorganic anti-reflective coating layer made of titanium, titanium dioxide, titanium nitride, chrome oxide, carbon, amorphous silicon, and so on, and the organic anti-reflective coating layer made of a polymer material. Conventionally, in comparison with the inorganic anti-reflective coating layer, the organic anti-reflective coating layer does not require complex and expensive apparatus such as a vacuum evaporator, a chemical vapor deposition (CVD) device, a sputter device and so on for forming the layer, and has a high absorptivity of a radioactive light, and low molecular weight materials does not diffuse from the organic anti-reflective coating layer into a photoresist layer during a heating, coating, and drying process, and the organic anti-reflective coating layer has an excellent etch rate in a dry etch process of a photolithography process.

FIG. 1 is a drawing for showing a method of generally forming the photoresist pattern. As shown in FIG. 1, the conventional method for forming the photoresist pattern can be roughly classified into a positive tone development (PTD) and a negative tone development (NTD). The PTD is a method of forming patterns by selectively dissolving and removing an exposed region of a photoresist film with a positive tone developer, and the NTD is a method for forming patterns by selectively dissolving and removing a non-exposed region of a photoresist film with a negative tone developer. Development of a fine pattern formation process using next-generation EUV (Extreme ultraviolet lithography), DSA (Diffusion Self Align), etc. has been delayed. The NTD enables the formation of fine patterns in comparison with the PTD by changing the alkaline developer to an organic developer using a current exposure equipment so that it is advantageous that additional equipment is not necessary.

Korean Unexamined Patent Publication No. 10-2011-0028763 discloses an isocyanurate compound for forming an organic anti-reflective coating layer represented by the following Formula 1 and a composition containing the same.

[Formula 1]

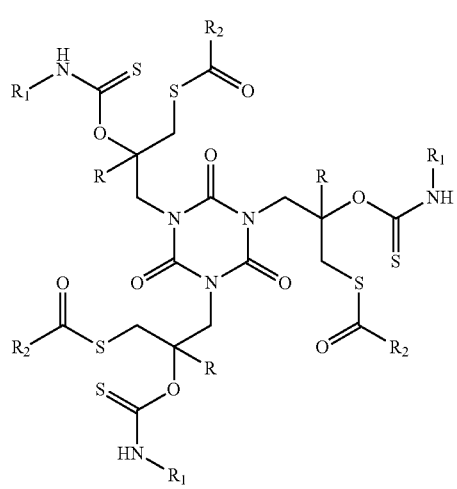

In Formula 1, R is independently a hydrogen atom or a methyl group, $R_1$ is independently a chain or cyclic saturated or unsaturated hydrocarbyl group of 1 to 15 carbon atoms containing 0 to 6 of hetero atoms, and $R_2$ is a chain or cyclic saturated or unsaturated hydrocarbyl group of 1 to 15 carbon atoms containing 0 to 15 hetero atoms.

The isocyanurate compound is excellent in stability and etching rate at high-temperature and has a high refractive index. When the isocyanurate compound is used in the PTD, the reflectivity is controlled and the pattern profile is corrected to form a vertical pattern so that the process margin is improved. On the other hand, when the isocyanurate compound is used in the NTD. The under-cut occurs at the photoresist bottom (PR bottom) portion, furthermore when it is severe, tunneling occurs, and the adhesion to the photoresist is poor so that the process margin is insufficient. It is required a study of a composition for forming an organic anti-reflective coating layer which controls the reflectivity by maintaining a high refractive index which is required in an immersion process, has high etch rate and excellent adhesion to the photoresist and can improve the process margin.

DISCLOSURE

Technical Problem

Therefore, it is an object of the present invention to provide a compound for forming an organic anti-reflective coating layer, which has a high refractive index, a high etch rate and an enhanced adhesion to the photoresist.

It is another object of the present invention to provide a compound for forming an organic anti-reflective coating layer, which can improve pattern profile by preventing undercut and so on.

Technical Solution

In order to achieve these objects, the present invention provides a composition for forming an organic anti-reflective coating layer comprising: an isocyanurate compound containing at least one moiety represented by the following Formula 2; a polymer represented by the following Formula 3; and an organic solvent for dissolving the above-mentioned components.

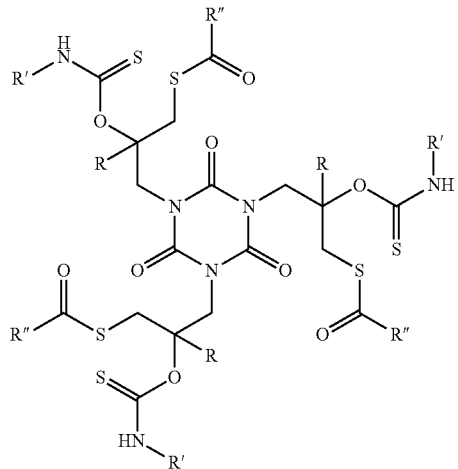

[Formula 2]

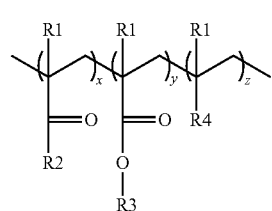

[Formula 3]

In Formula 2, R is independently a hydrogen atom or a methyl group, R' is independently a chain or cyclic saturated or unsaturated hydrocarbyl group of 1 to 15 carbon atoms containing 0 to 6 of hetero atoms, and R' is independently a chain or cyclic saturated or unsaturated hydrocarbyl group of 1 to 15 carbon atoms containing 0 to 8 of hetero atoms, and two or more moieties represented by formula 2 can be connected through R'. In Formula 3, $R_1$ is independently a hydrogen or a methyl group (—$CH_3$), $R_2$ is a hydroxyl group (—OH) or an alkoxyl group of 1 to 5 carbon atoms containing 0 to 2 hydroxyl groups, $R_3$ is a chain or cyclic saturated or unsaturated hydrocarbyl group of 3 to 15 carbon atoms containing 0 to 2 of hetero atoms, $R_4$ is an aryl group of 5 to 15 carbon atoms containing 0 to 3 of hetero atoms, x, y and z each is the mole % of each repeating unit constituting the polymer, x is 20 to 80 mole %, y is 1 to 30 mole % and z is 10 to 50 mole %.

The present invention also provides a method for forming an organic anti-reflective coating layer comprising of coating a composition for forming an organic anti-reflective coating layer on an etching layer; and of crosslinking the composition for forming an organic anti-reflective coating layer which is coated.

Technical Effects

The composition for forming an organic anti-reflective coating layer of the present invention has high refractive index even at the light of short wavelength of 193 nm because of its nitrogen atoms (N), sulfur atoms (S) and oxygen atoms (O). Owing to the carbon-oxygen bonds (C—O bond) contained in the composition, the organic anti-reflective coating layer with a superior etch rate can be formed. Moreover, since the composition for forming an organic anti-reflective coating layer contains a deprotecting group, hydrophilicity of the exposed portion can be controlled to enhance the adhesion to the photoresist. Also, the composition includes the photoacid generator to supply a deficient acid in the lower portion of the photoresist in the exposed portion so that the profile of the pattern such as undercut can be improved, thereby forming a vertical pattern profile. Therefore, the organic layer formed by the composition of the present invention is useful as an organic anti-reflective coating layer in a photolithography process of forming a pattern using a native tone developer. Further, by using the composition of the present invention, it is possible to form a finer pattern than a pattern formed by the PTD by using existing exposure equipment, thereby reducing a pattern formation cost and thus being economical.

DETAILED DESCRIPTION OF INVENTION

Figure 1:
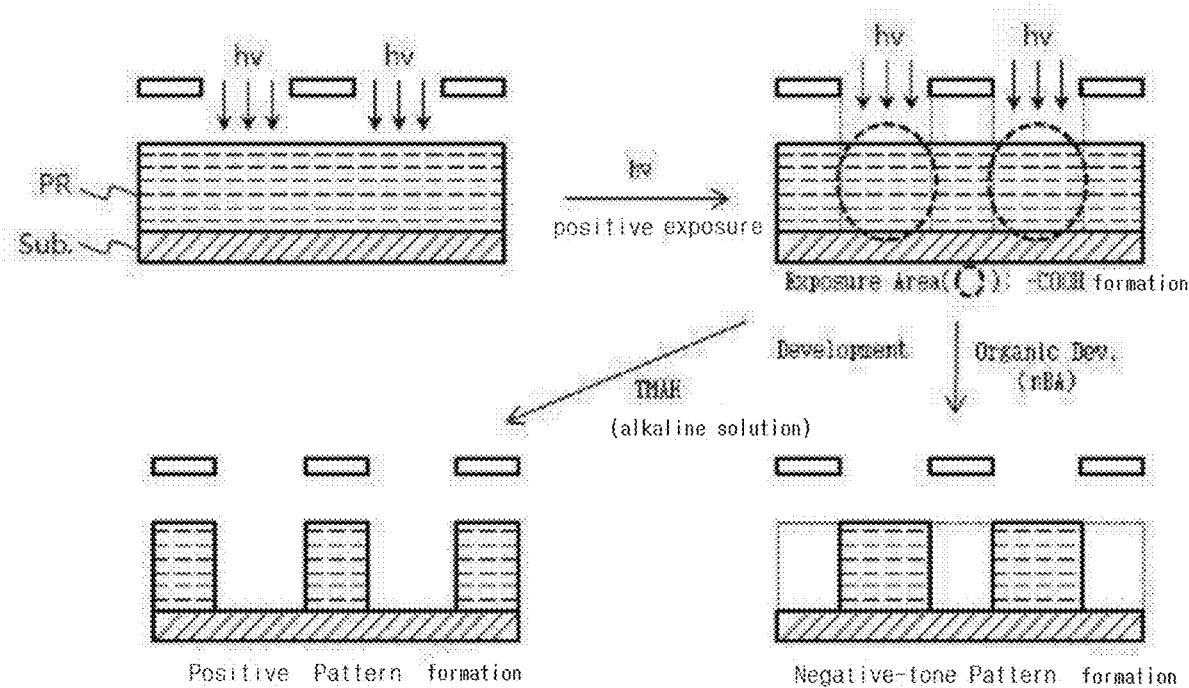
FIG. 1 shows a method of generally forming the photoresist pattern.

Hereinafter, a more complete appreciation of the invention, and many of the attendant advantages thereof, will be better appreciated by reference to the following detailed description.

The composition for forming an organic anti-reflective coating layer according to the present invention has a high refractive index and a high etch rate and improves a profile such as an undercut, thereby improving a process margin. The composition includes an isocyanurate compound, a polymer (adhesive strength-enhancing polymer) and an organic solvent.

The isocyanurate compound contains hetero atoms such as sulfur, nitrogen and oxygen atoms, etc. so that an organic anti-reflective coating layer has a high refractive index even at the light of short wavelength of 193 nm, and it also contains a carbon-oxygen bonds (C—O bond) so that the organic anti-reflective coating layer has a high etch rate. The isocyanurate compound contains at least one moiety represented by following Formula 2.

[Formula 2]

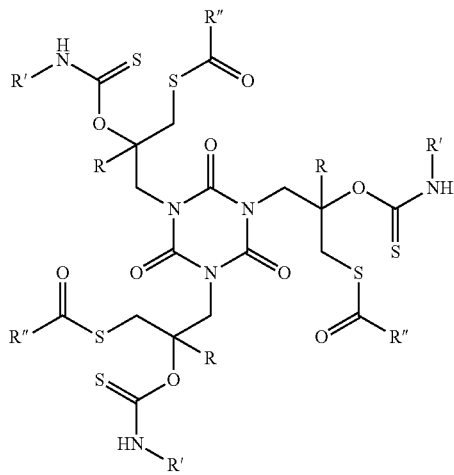

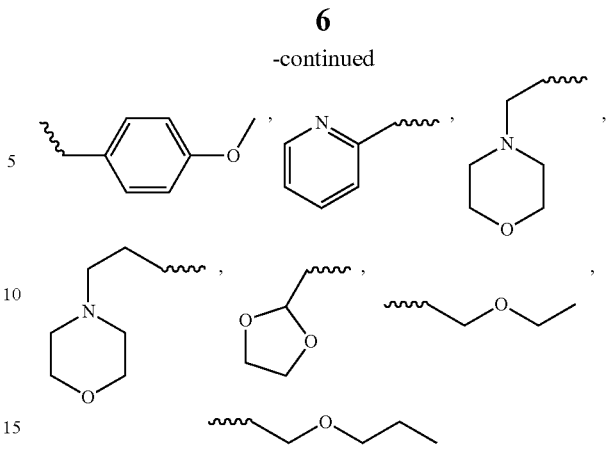

and so on (wherein, the wavy line ($\sim$) indicates a bonding part). Specific examples of R" include

In Formula 2, R is independently a hydrogen atom or a methyl group, R' has at least one bonding part ($\sim$), and is independently a chain or cyclic saturated or unsaturated hydrocarbyl group of 1 to 15 carbon atoms containing 0 to 6 of hetero atoms, preferably, a chain or cyclic saturated or unsaturated hydrocarbyl group of 1 to 8 carbon atoms containing 0 to 3 of hetero atoms such as a nitrogen atom (N) and/or an oxygen atom (O), and R" is independently a chain or cyclic saturated or unsaturated hydrocarbyl group of 1 to 15 carbon atoms containing 0 to 8 of hetero atoms.

More specifically, R' is independently an alkyl group of 1 to 10 carbon atoms, preferably 1 to 8 carbon atoms containing 0 to 2 of hetero atoms, preferably an oxygen atom. R" is independently (i) an alkyl group of 1 to 10 carbon atoms, preferably 1 to 6 carbon atoms containing 0 to 2 of hetero atoms, preferably an oxygen atom and/or a sulfur atom, or (ii) a cycloalkyl group, an aryl group or a heterocyclic group of 4 to 10 carbon atoms, preferably 5 to 6 carbon atoms containing 0 to 2 hetero atoms, preferably an oxygen atom and/or a sulfur atom.

Specific examples of R' include

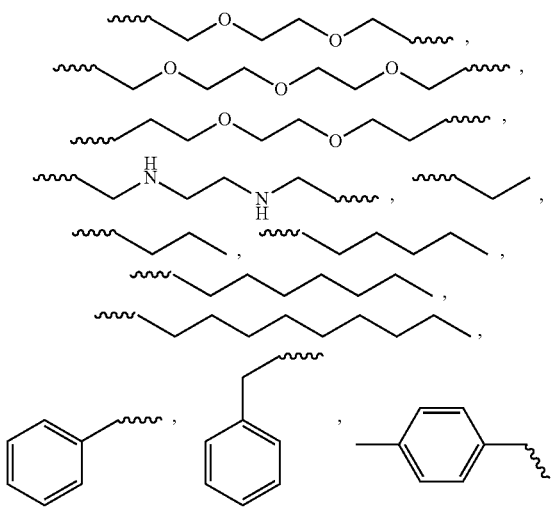

and so on (wherein, the wavy line ($\sim$) indicates a bonding part). In the case where R' has two or more bonding parts, the R' may be connected to R' of other isocyanurate moiety of Formula 2 to form the isocyanurate compound. For example, when the two isocyanurate moieties of Formula 2 are bonded to form an isocyanurate compound, R' in one isocyanurate moiety and R' in other isocyanurate moiety can be bonded. Alternatively, the two isocyanurate moieties are bonded to form an isocyanurate compound, the two isocyanurate moieties can share only one R'. Namely, R' in one isocyanurate moiety is bonded to other isocyanurate moiety without R' at the position of the removed R'.

As the isocyanurate compound for the present invention, it is preferable to use a polymer which is prepared by reacting the isocyanurate moieties containing R' having two or more bonding parts or which is prepared by crosslinking the isocyanurate moieties with a crosslinking agent in an organic anti-reflective coating layer forming process. The weight average molecular weight (Mw) of the isocyanurate compound is 2,000 to 10,000, preferably 4,000 to 8,000. If the weight average molecular weight is too small, the organic anti-reflective coating layer may be dissolved in the photoresist solvent. If the weight average molecular weight is too large, the solubility of the organic anti-reflective coating layer to the solvents may be low and the etching rate of the organic anti-reflective coating layer may be lowered in the dry etching process.

Representative examples of the isocyanurate compound represented by Formula 2 include compounds containing a repeating unit represented by following Formulas 2a to 2h.

[Formula 2a]
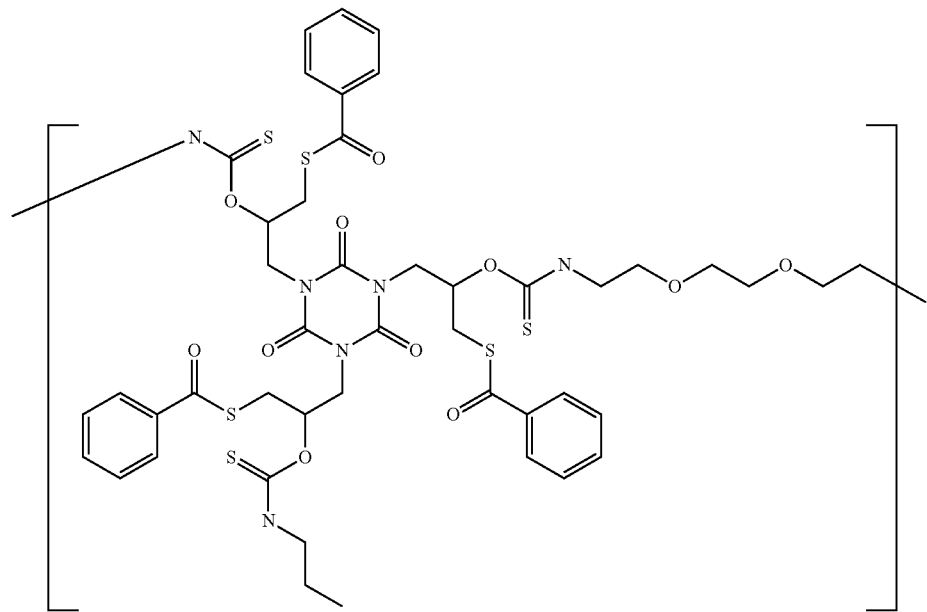
[Formula 2b]
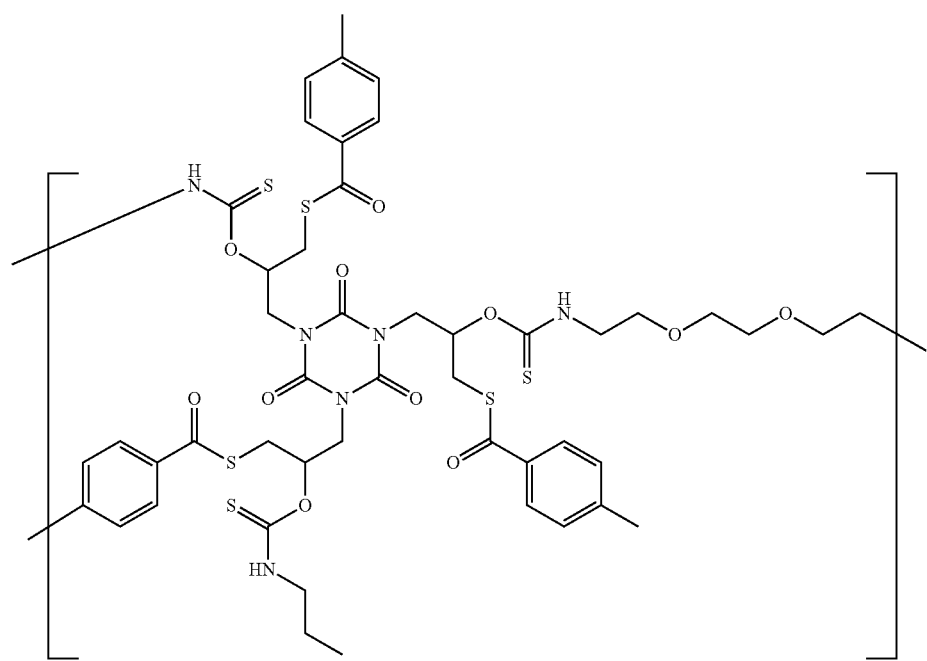

[Formula 2c]
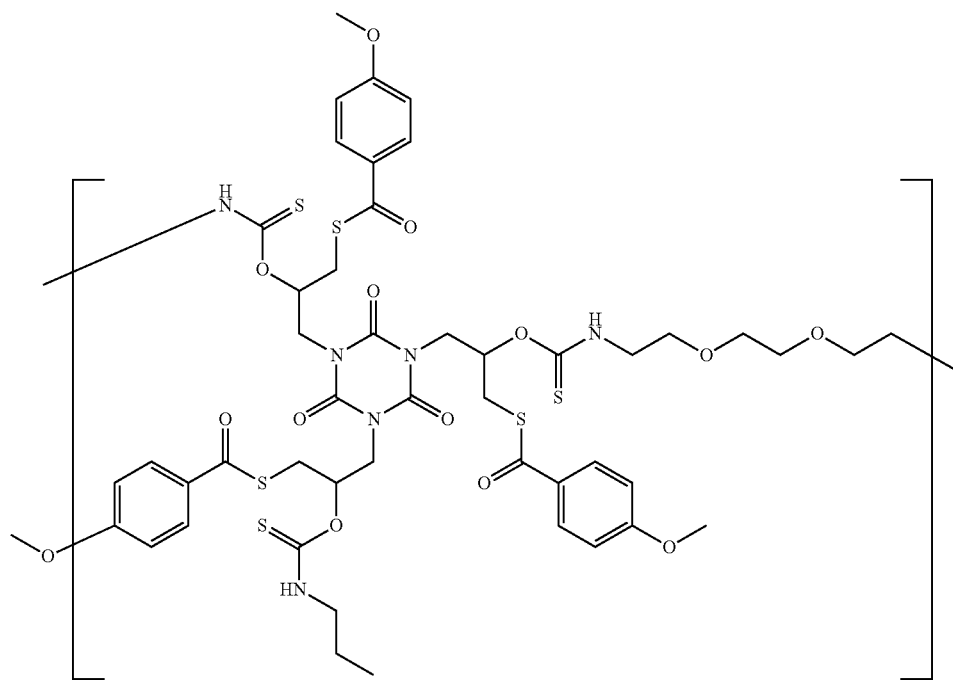
[Formula 2d]
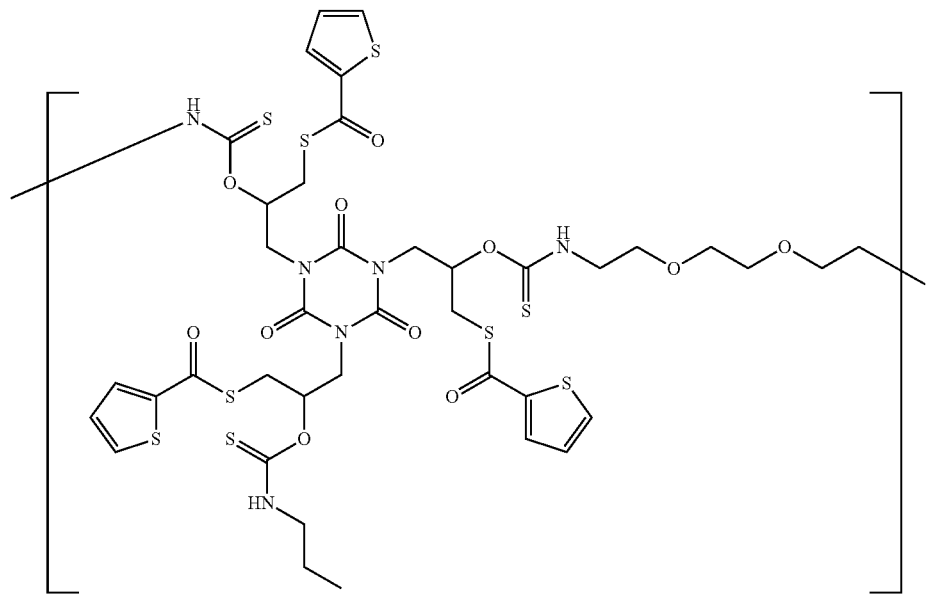

[Formula 2e]
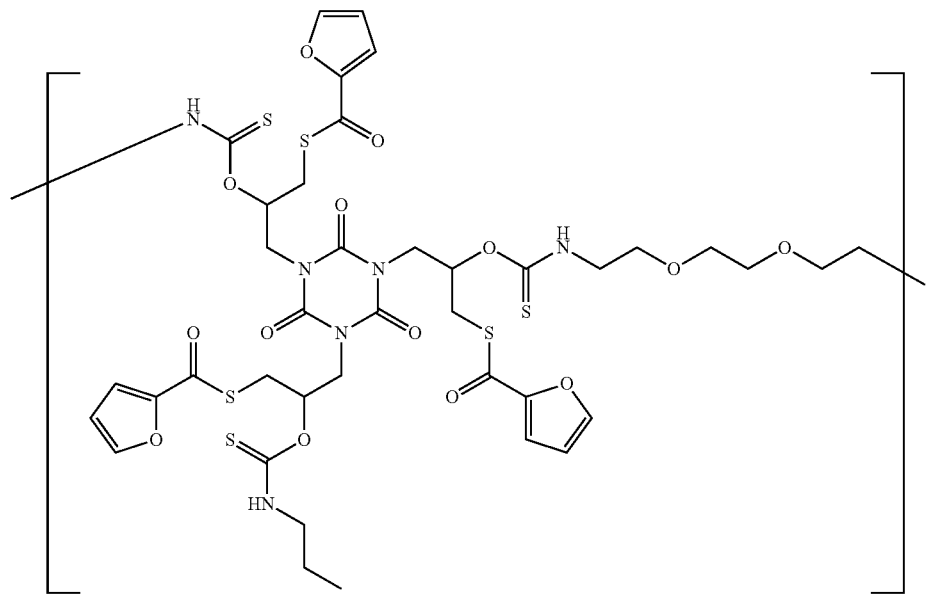
[Formula 2f]
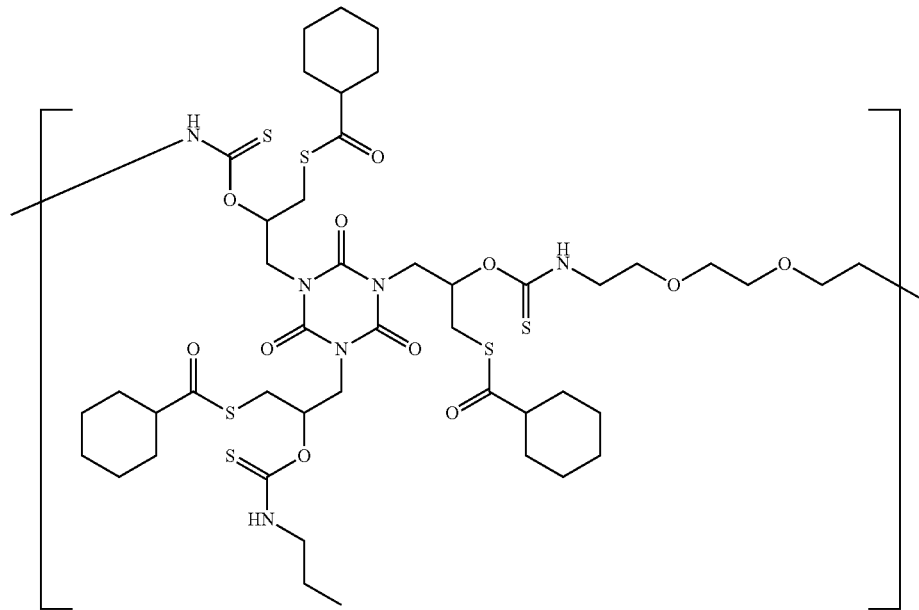

[Formula 2g]

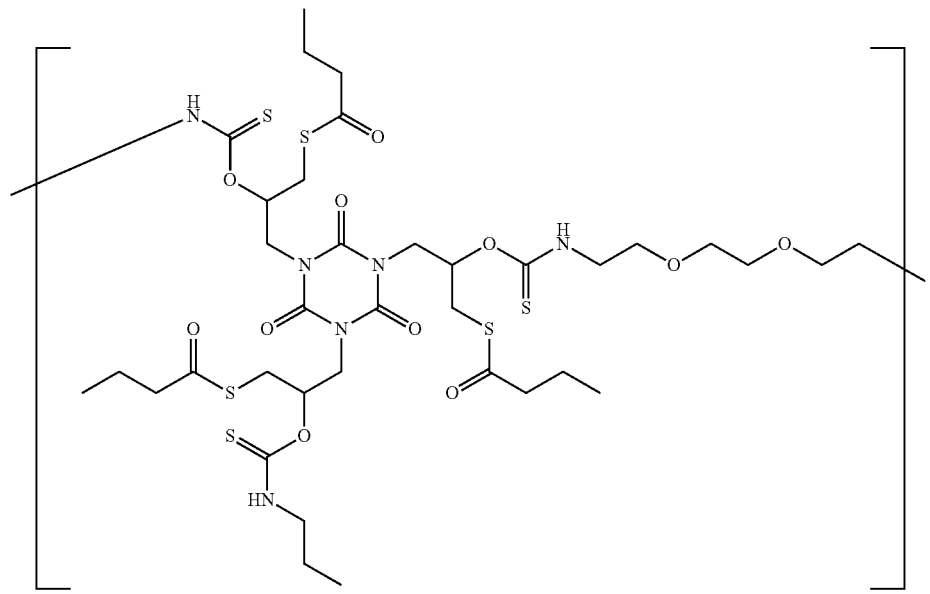

[Formula 2h]

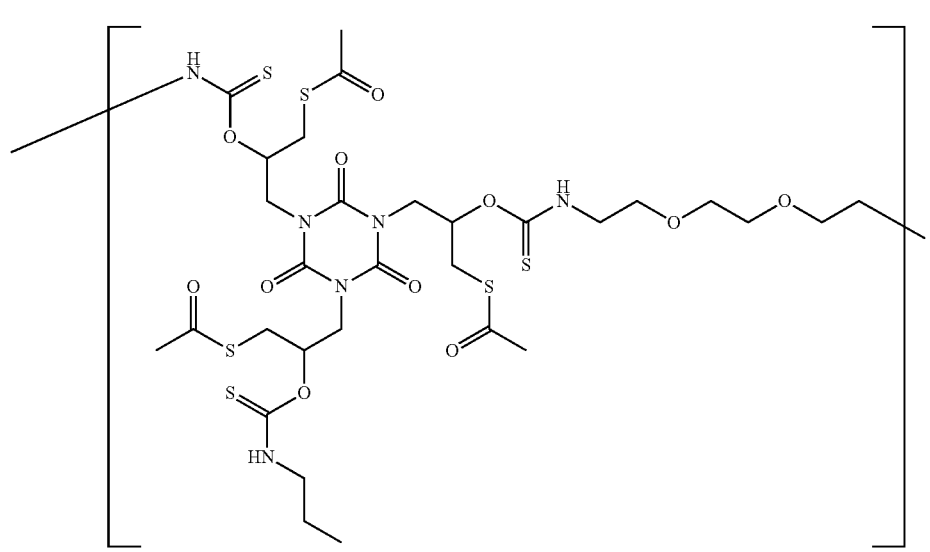

The polymer which controls the hydrophilicity of the exposed portion to enhance adhesion to the photoresist and then prevent collapse of the photoresist pattern, is represented by following Formula 3.

[Formula 3]

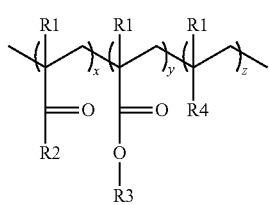

In Formula 3, $R_1$ is independently a hydrogen or a methyl group (—CH$_3$) and $R_2$ which is a cross-linking site, is a hydroxyl group (—OH) or an alkoxyl group of 1 to 5 carbon atoms containing 0 to 2 hydroxyl groups. $R_3$ which is a deprotecting group, is a chain or cyclic saturated or unsaturated hydrocarbyl group (carbon compound) of 3 to 15 carbon atoms containing 0 to 2 of hetero atoms, $R_4$ which is a chromophore absorbing light, is an aryl group of 5 to 15 carbon atoms containing 0 to 3 of hetero atoms.

Specifically, $R_2$ is an alkoxy group of 1 to 3 carbon atoms containing 0 to 2 hydroxyl groups (for example, —OCH$_3$, —OCH$_2$CH$_2$OH and so on), $R_3$ is an alkyl group or cycloalkyl group of 3 to 12 carbon atoms containing 0 to 2 hydroxyl groups, preferably 0 to 1 hydroxyl group, or a heterocyclic groups of 3 to 12 carbon atoms containing 1 to 2 oxygen atoms, more preferably an alkyl group of 1 to 6 carbon atoms, a heterocyclic group of 4 to 8 carbon atoms containing 1 to 2 oxygen atoms or an adamantyl group of 10 to 12 carbon atoms containing 0 to 2 hydroxyl groups (for example,

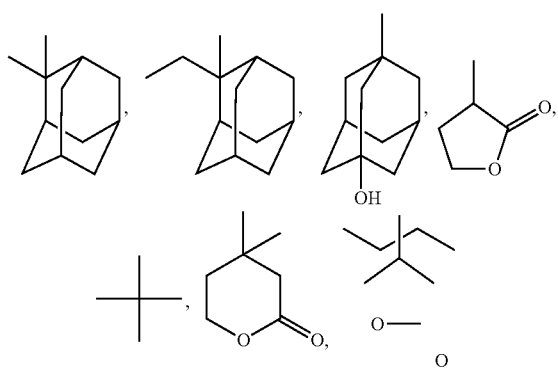

and so on). $R_4$ is an aryl group of 6 to 12 carbon atoms containing 0 to 2 oxygen atoms, preferably a hydroxyl group or an aryl group of 6 to 10 carbon atoms which is unsubstituted or substituted with an alkoxy group of 1 to 5 carbon atoms, containing 0 to 2 oxygen atoms (for example,

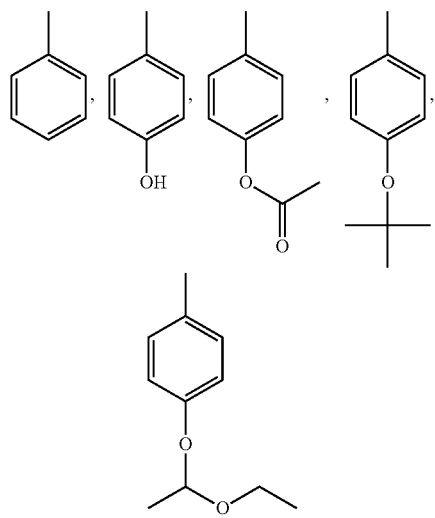

and so on).

In Formula 3, x, y and z each is the mole % of each repeating unit with respect to total repeating units constituting the compound of Formula 3. x is 20 to 80 mole %, preferably 40 to 70 mole %, more preferably 50 to 60 mole %, y is 1 to 30 mole %, preferably 5 to 25 mole %, more preferably 10 to 20 mole %, and z is 10 to 50 mole %, preferably 15 to 45 mole %, more preferably 20 to 40 mole %. If the amount of x is too small, the organic anti-reflective coating layer may be dissolved in the photoresist solvent. If the amount of y is too small, the adhesion to the photoresist pattern may be lowered and the pattern may be collapsed, and if the amount of y is too large, a footing profile may be formed. Also, the amount of z is out of the range, the organic anti-reflective coating layer cannot absorb the reflected light, which may cause problems in pattern profile such as undercutting. Also, weight average molecular weight of the adhesive strength-enhancing polymer 3,000 to 10,000, preferably 5,000 to 8,000. If the weight average molecular weight of the adhesive strength-enhancing polymer is too small, it may be difficult to form an organic anti-reflective coating layer and if the weight average molecular weight of the adhesive strength-enhancing polymer is too large, it may not be effective to form the organic anti-reflective coating layer.

Representative examples of the adhesive strength-enhancing polymer represented by Formula 3 include compounds represented by following Formulas 3a to 3g. In Formulas 3a to 3g, x, y and z are the same as defined in the above formula 3.

[Formula 3a]

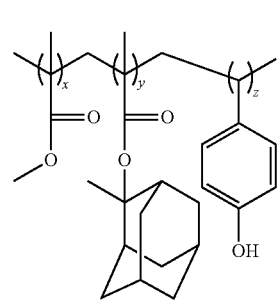

[Formula 3b]

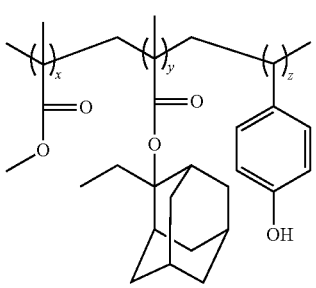

[Formula 3c]

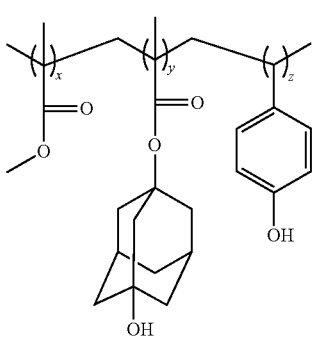

[Formula 3d]

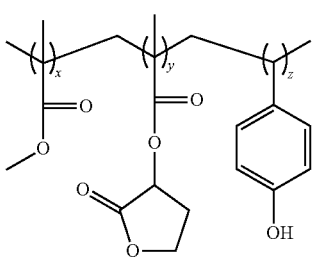

[Formula 3e]

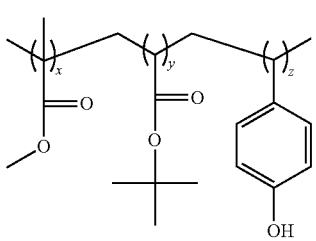

-continued

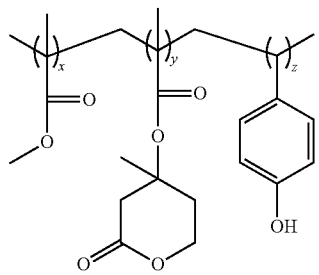
[Formula 3f]

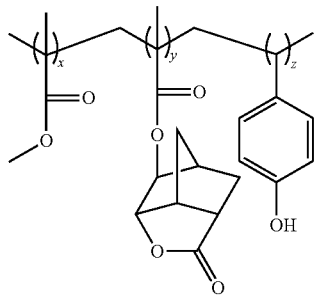
[Formula 3g]

As the organic solvent used in the present invention, the conventional organic solvents for the composition for forming an organic anti-reflective coating layer can be used. Exemplary organic solvents include, but are not limited to, cyclohexanone, cyclopentanone, butyrolactone, dimethylacetamide, dimethylformamide, dimethylsulfoxide, N-methyl pyrrolidone (NMP), tetrahydro furfural alcohol, propylene glycol monomethyl ether (PGME), propylene glycol monomethyl ether acetate (PGMEA), ethyl lactate, mixtures thereof, and so on. It is preferable to use PGMEA, PGME, cyclopentanone and mixture thereof as the organic solvent.

In the composition for forming an organic anti-reflective coating layer, the amount of the isocyanurate compound is 1 to 10 weight %, preferably 1 to 5 weight %, more preferably 1 to 3 weight % and the amount of the polymer is 0.1 to 5 weight %, preferably 0.1 to 2 weight %, more preferably 0.5 to 1 weight %. The remaining component other than the isocyanurate compound, the polymer and additives (cross-linking agent, acid generator, etc.) is the solvent. For example, the amount of the solvent is 85 to 98.9 weight %, preferably 92.1 to 98.87 weight %, more preferably 95.3 to 98.3 weight %. If the amount of the isocyanurate compound is out of the range, the refractive index and the etching rate are lowered to reduce the efficiency for forming the organic anti-reflective coating layer. If the amount of the polymer is out of the range, the adhesion to the photoresist is lowered or the pattern profile may have problems of undercut and so on.

In addition, the ratio (weight ratio) of the polymer and the isocyanurate compound can be appropriately determined. Specifically, the ratio of polymer:isocyanurate compound may be 1:0.5 to 10, more specifically 1 to 6, preferably 1:2 to 5. For example (a) when the amount of the polymer is 0.3 weight %, the amount of the isocyanurate compound is 1.7 weight %, and (b) when the amount of the polymer is 0.9 weight %, the amount of the isocyanurate compound is 1.10 weight %. If the ratio of the polymer and the isocyanurate compound is out of the range (a), the adhesion to the photoresist is lowered and collapse occurs, to reduce the process yield. If the ratio of the polymer and the isocyanurate compound is out of the range (b), the reflectivity is increase and the exposed light may not be absorbed and thereby the photoresist pattern problems of under-cut, footing, standing wave or the like may be occurred to reduce the process yield.

The composition for forming an organic anti-reflective coating layer according to the present invention may further comprise a crosslinking agent and an acid generator. The crosslinking agent is for forming a polymer by crosslinking the isocyanurate compound so as to form an organic anti-reflective coating layer. As the crosslinking agent, a conventional crosslinking agent, for example, a melamine-based crosslinking agent may be used.

The acid generator is to promote crosslinking reaction of the isocyanurate compound and to improve the pattern profile of undercut by supplying an acid to the lower portion of the photoresist. As the acid generator, the conventional acid generators (photoacid generator (PAG) and/or thermal acid generator) can be used. Examples of the photoacid generator includes a sulfonium salt-based compound, an iodonium salt-based compound, an onium salt-based compound, an organic sulfonic acid, and mixture thereof. Preferably dodecylbenzensulfonic acid, p-toluene sulfonic acid, phthalimido trifluoromethanesulfonate, dinitrobenzyltosylate, n-decyl disulfone, naphthylimidotrifluoro methanesulfonate, diphenyl iodonium triflate, diphenyl iodonium nonaflate, diphenyl iodonium hexafluorophosphate, diphenyl iodonium hexafluoroarsenate, diphenyl iodonium hexafluoroantimonate, diphenyl paramethoxy phenylsulfonium triflate, diphenyl paratoluene sulfonium triflate, diphenyl paratertiarybutyl phenyl sulfonium triflate, diphenyl paraisobutyl phenyl sulfonium triflate, triphenylsulfonium triflate, tris(p-tert-butylphenyl) sulfonium triflate, diphenyl paramethoxyphenyl sulfonuim nonaflate, diphenyl paratoluenylsulfonium nonaflate, diphenyl para-tertiary butylphenylsulfonium nonaflate, diphenyl paraisobutylphenylsulfonium nonaflate, triphenylsulfonium nonaflate, tris-para-tert-butylphenylsulfonium nonaflate, hexafluoroarsenate, triphenylsulfonium hexafluoroantimonate, dibutylnaphthylsulfonium triflate, and mixture thereof can be used.

With respect to total of the composition for forming the organic anti-reflective coating layer of the present invention, the amount of the crosslinking agent is 0.01 to 0.4 weight %, preferably 0.1 to 0.3 weight %, the amount of the acid generator is 0.02 to 0.5 weight %, preferably 0.1 to 0.2 weight %. If the amount of the crosslinking agent is too small, the organic anti-reflective coating layer may not be formed, and if the amount of the crosslinking agent is too large, footing can occur in the pattern profile. If the amount of the acid generator is too small, the organic anti-reflective coating layer may not be formed, and if the amount of the acid generator is too large, fumes may be generated in the heating process and the manufacturing equipment may be contaminated.

The organic anti-reflective coating layer according to the present invention can be formed by carrying the step of coating the composition for forming an organic anti-reflective coating layer on an etching layer such as silicon wafer and aluminum substrate, and the step of crosslinking the composition for forming an organic anti-reflective coating layer coated on the etching layer. The step of coating the composition for forming an organic anti-reflective coating layer can be performed by a conventional method such as spin coating, roller coating, and so on, and the step of crosslinking the coated composition for forming an organic anti-reflective coating layer can be performed by heating with an apparatus such as a high temperature plate, a convection oven, and so on. The heating temperature for the crosslinking is 90 to 240° C., preferably 150 to 210° C. If the heating temperature is less than 90° C., the organic solvent in the composition for forming the organic anti-reflective coating layer may not be removed sufficiently, and the crosslinking reaction may not be carried out sufficiently. If the heating temperature is more than 240° C., the organic anti-reflective coating layer and the composition for forming the same may become chemically unstable.

Hereinafter, the present invention will be described in more detail with reference to specific examples. The examples below are only to illustrate the present invention, and the present invention is not limited to the examples below.

[Manufacturing Example 1] Preparation of the Isocyanurate Compound

A. Preparation of the Isocyanurate Compound 5 g (0.0095 mol) of tris(1,3-oxathiolane-2-thion-5-ylm-ethyl)isocyanurate, 1.41 g (0.0095 mol) of the compound

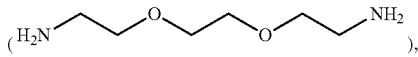

), 3.46 g (0.0285 mol) of the compound

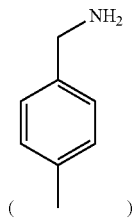

and 55.91 g of dimethyl formamide (DMF) were into a reactor, and reacted with stirring for 24 hours at room temperature (25° C.) to obtain the isocyanurate compound represented by Formula 4 (in following Formula 4, $R_5$ is

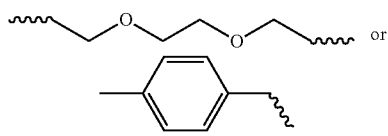

(mole ratio in the total compound:

 = 1:3), and if $R_5$ is

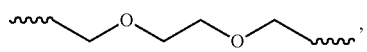, the other two except $R_5$ of the isocyanurate compound represented by Formula 4 were connected to

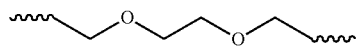

to form a polymer. Yield: 85%, molecular weight (Mw): 4,905, polydispersity index (PDI): 1.83).

[Formula 4]

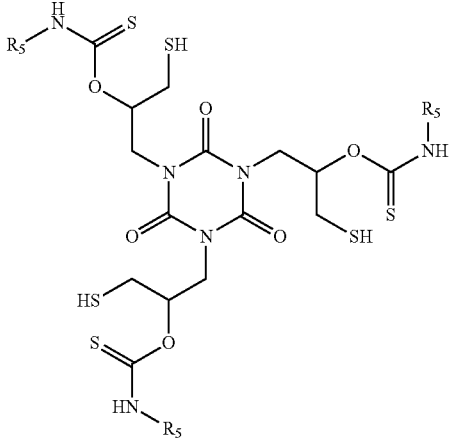

B. Preparation of the Isocyanurate Compound Represented by Formula 2e 76.29 g of tetrahydrofuran (THF) was added into a reactor (250 ml round bottomed flask), and 10 g of the isocyanurate compound represented by Formula 4 was added and dissolved, and 3.96 g of triethylamine (TEA) was added, and the temperature of the solution was lowered to 0° C. using an ice-bath. 5.11 g of the compound

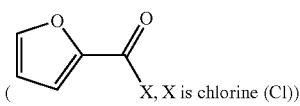 X, X is chlorine (Cl))

was slowly added in the solution, and reacted for 30 minutes, and further reacted for 15 hours after removing the ice bath. After the completion of the reaction, solid was filtrated. And the rest solution was precipitated in diethyl ether followed by filtration and dry to obtain the isocyanurate compound represented Formula 2e (yield: 78.6%, molecular weight (Mw): 5,121, polydispersity index (PDI): 1.81).

[Manufacturing Examples 2 to 8] Preparation of Polymers

The amount shown in Table 1 of reactants 1 to 3 was placed in a 500 ml round bottomed flask and then tetraHydroFuran (THF) is added to dissolve the reactants 1 to 3. Next, the temperature was raised to 70° C. using an oil bath, and then 2.3 g of azobisisobutyronitrile (AIBN) was added as an initiator, followed by reaction for 15 hours. After completion of the reaction, the temperature was lowered to 50° C., 180 g of methanol was added, followed by stirring for 30 minutes. Then, 18.75 g of ammonia water was added and reacted for 15 hours. After the reaction was completed, the temperature was lowered to room temperature, and the powder precipitated in water was filtered and dried to obtain polymers (Manufacturing Examples 2 to 8) (Yield, molecular weight (Mw) and polydispersity index(PDI): See below Table 1). In Table 1, reactants 1, 2 and 3 are ethylene monomers used in the polymerization of formulas 3a to 3g.

TABLE 1

| Product | Reactant 1 (R2 = Methoxy group) | Reactant 2 (R3) kind | Reactant 2 (R3) amount | Reactant 3 (R4 = Phenolic group) | initiator | yeld (%) | Mw | PDI |
|---|---|---|---|---|---|---|---|---|
| Manufacturing Example 2 (Formula 3a) | 10 g | (adamantyl-methyl) | 4.68 g | 12.96 g | 2.3 g | 63.1 | 5850 | 1.81 |
| Manufacturing Example 3 (Formula 3b) | 10 g | (ethyl adamantyl) | 4.96 g | 12.96 g | 2.3 g | 62.1 | 5932 | 1.79 |
| Manufacturing Example 4 (Formula 3c) | 10 g | (hydroxy adamantyl) | 4.72 g | 12.96 g | 2.3 g | 59.0 | 6211 | 1.78 |
| Manufacturing Example 5 (Formula 3d) | 10 g | (methyl γ-butyrolactone) | 3.40 g | 12.96 g | 2.3 g | 64.8 | 5723 | 1.83 |
| Manufacturing Example 6 (Formula 3e) | 10 g | (tert-butyl) | 2.56 g | 12.96 g | 2.3 g | 56.3 | 5518 | 1.81 |
| Manufacturing Example 7 (Formula 3f) | 10 g | (dimethyl δ-valerolactone) | 3.96 g | 12.96 g | 2.3 g | 58.5 | 6125 | 1.85 |
| Manufacturing Example 8 (Formula 3g) | 10 g | (branched alkyl ester) | 4.44 g | 12.96 g | 2.3 g | 52.7 | 6241 | 1.78 |

[Examples 1 to 7 and Comparative Example 1] Preparation of Compositions for Forming the Organic Anti-Reflective Coating Layer 1.25 weight % of the isocyanurate compound of Manufacturing Example 1, 0.75 weight % of each polymer prepared in Examples 2 to 8, 0.1 weight % of 2-hydroxyhexyl p-toluenesulfonate as the acid generator, 0.1 weight % of triphenylsulfonium nonaflate as the photoacid generator and 0.2 weight % of PL1174 as the crosslinking agent were dissolved in solvent of 4.84 weight % of cyclohexanone and 92.01 weight % of PGMEA, to obtain compositions for forming the organic anti-reflective coating layers of Examples 1 to 7. 2 weight % of the isocyanurate compound of Manufacturing Example 1, 0.1 weight % of 2-hydroxyhexyl p-toluenesulfonate as the acid generator and 0.2 weight % of PL1174 as the crosslinking agent were dissolved in 97.7 weight % of PGMEA of solvent, to obtain composition for forming the organic anti-reflective coating layer of the Comparative Example 1.

[Examples 8 to 14] Preparation of Compositions for Forming the Organic Anti-Reflective Coating Layer 1.70 weight % of the isocyanurate compound of Manufacturing Example 1, 0.30 weight % of each adhesive strength-enhancing polymer prepared in Examples 2 to 8, 0.1 weight % of 2-hydroxyhexyl p-toluenesulfonate as an acid generator, 0.1 weight % of triphenic sulfonium nonaflate as the photoacid generator and 0.2 weight % of PL1174 as the crosslinking agent were dissolved in solvent of 4.84 weight % of cyclopentanone, 92.01 weight % of PGMEA, to prepare compositions for forming the organic anti-reflective coating layers of the Examples 8 to 14.

[Examples 15 to 21] Preparation of Compositions for Forming the Organic Anti-Reflective Coating Layer 1.10 weight % of the isocyanurate compound of Manufacturing Example 1, 0.90 weight % of each adhesive strength-enhancing polymer prepared in Examples 2 to 8, 0.1 weight % of 2-hydroxyhexyl p-toluenesulfonate as an acid generator, 0.1 weight % of triphenic sulfonium nonaflate as the photoacid generator and 0.2 weight % of PL1174 as the crosslinking agent were dissolved in solvent of 4.84 weight % of cyclopentanone, 92.01 weight % of PGMEA, to prepare compositions for forming the organic anti-reflective coating layers of the Examples 15 to 21.

[Experimental Example 1] Formation and Test of an Organic Anti-Reflective Coating Layer Each of the compositions prepared in Examples 1 to 21 and Comparative Example 1 was spin-coated on a silicon wafer at 1,500 rpm and baked at 205° C. for 60 seconds to form an organic anti-reflective coating layer. The contact angle of each organic anti-reflective coating layer was measured using a contact angle equipment (apparatus name: DSA-100, manufacturer: KRUSS) and a general method disclosed in Burnett et al., J. Vac. Sci. Techn. B, 23 (6), pages 2721-2727 (Nov. Dec 2005). The results are shown in Table 2 below.

TABLE 2

| Organic anti-reflective coating layer | Contact Angle |
|---|---|
| Comparative Example 1 | 72 |
| Example 1 | 62 |
| Example 2 | 63 |
| Example 3 | 60 |
| Example 4 | 64 |
| Example 5 | 63 |
| Example 6 | 62 |
| Example 7 | 61 |
| Example 8 | 69 |
| Example 9 | 66 |
| Example 10 | 69 |
| Example 11 | 70 |
| Example 12 | 68 |
| Example 13 | 67 |
| Example 14 | 69 |
| Example 15 | 58 |
| Example 16 | 59 |
| Example 17 | 56 |
| Example 18 | 61 |
| Example 19 | 60 |
| Example 20 | 60 |
| Example 21 | 58 |

Figure 2:
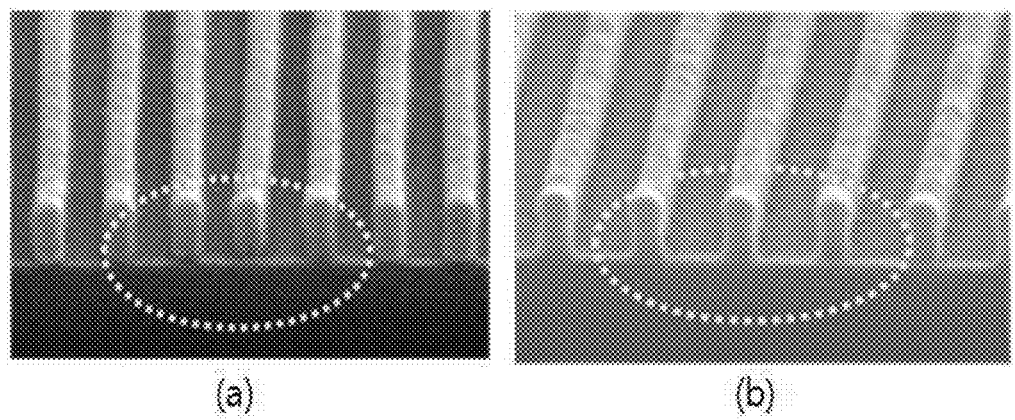
FIG. 2 shows a lithography test result (a) of organic anti-reflective coating layer formed by the conventional method and a lithography test result (b) of organic anti-reflective coating layer formed by one embodiment of the present invention.
Figure 3:
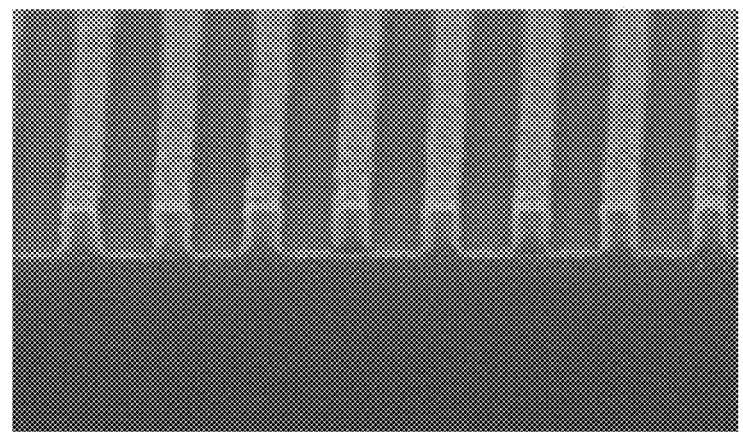
FIG. 3 shows a lithography test result of organic anti-reflective coating layer formed by Example 22 of the present invention.
Figure 4:
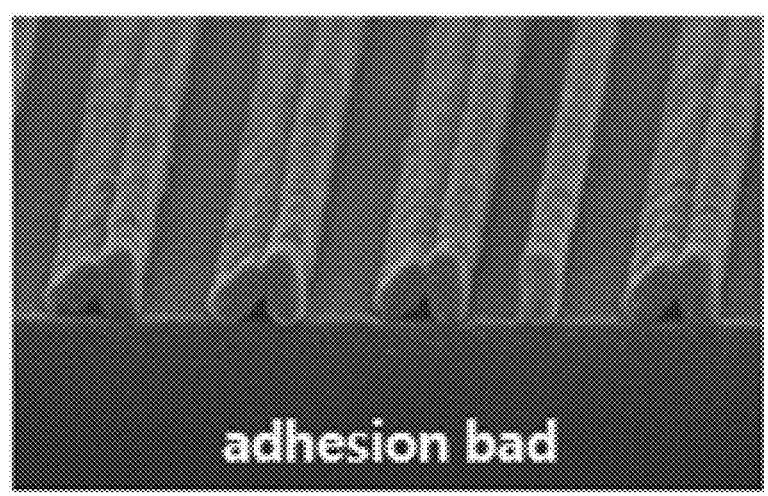
FIGS. 4 to 7 show lithography test results of organic anti-reflective coating layers formed by Comparative Examples 1 to 4 of the present invention.
Figure 5:
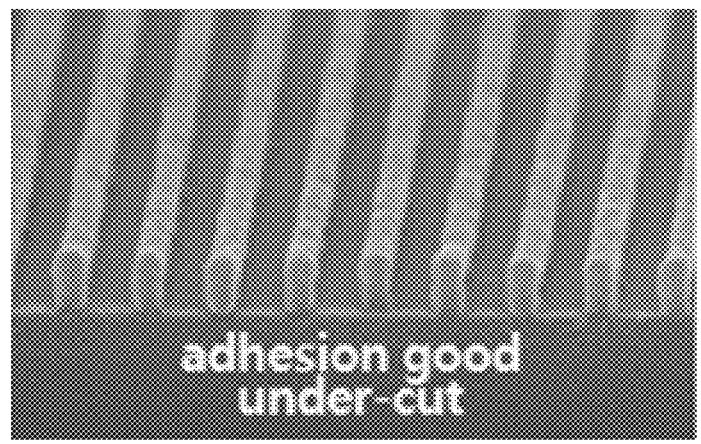
Figure 6:
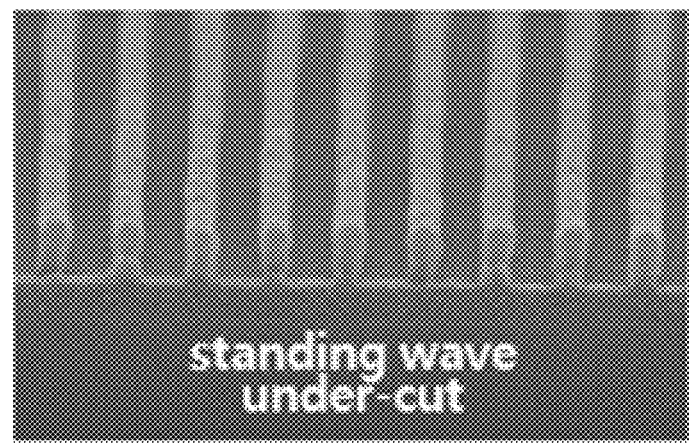
Figure 7:
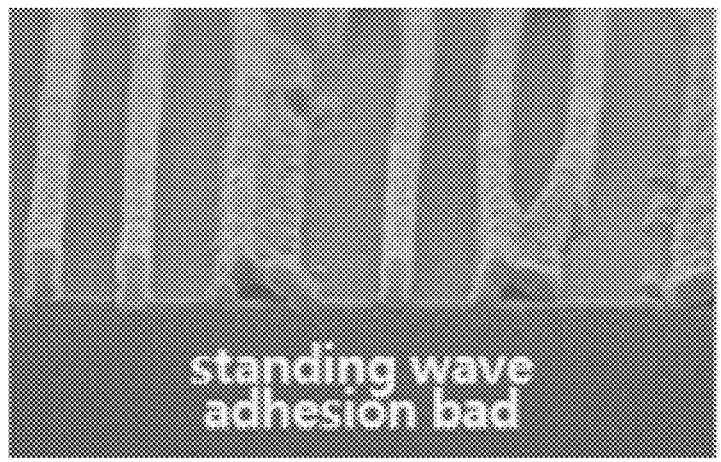

FIG. 2 shows a lithography test result (a) of organic anti-reflective coating layer formed by the conventional method and a lithography test result (b) of organic anti-reflective coating layer formed by one embodiment of the present invention. As shown from the Table 2 and FIG. 2, when a negative tone development process is applied, in the organic anti-reflective coating layer formed by using a conventional composition for forming an organic anti-reflective coating layer, the under-cut occurs in which the bottom of the pattern is melted in the development process (yellow circle in (a) of FIG. 2) and its contact angle is relatively high. However, in the organic anti-reflective coating layer formed by using a composition for forming an organic anti-reflective coating layer according to the present invention, the under-cut due to the reflected light is effectively suppressed to improve the profile of the pattern (yellow circle in (b) of FIG. 2) and its contact angle is relatively low, and adhesion with the photoresist is improved. Therefore, the composition for forming an organic anti-reflective coating layer according to the present invention is useful as an organic anti-reflective coating composition used in a negative tone developing process.

[Example 22] Formation of an Organic Anti-Reflective Coating Layer 1.25 weight % of the isocyanurate compound of Manufacturing Example 1, 0.75 weight % of adhesive strength-enhancing polymer prepared in Example 5, 0.1 weight % of 2-hydroxyhexyl p-toluenesulfonate as an acid generator, 0.1 weight % of triphenic sulfonium nonaflate as the photoacid generator and 0.2 weight % of PL1174 as the crosslinking agent were dissolved in solvent of 4.84 weight % of cyclopentanone, 92.01 weight % of PGMEA, to prepare composition for forming the organic anti-reflective coating layer. An organic antireflection film was formed in the same manner as in Experimental Example 1 by using the composition for forming an organic anti-reflective coating layer, and the lithography test was performed.

[Reference Example 1] Formation of an Organic Anti-Reflective Coating Layer

Except for using 1.95 weight % of the isocyanurate compound prepared in Manufacturing Example 1 and 0.05 weight % of adhesive strength-enhancing polymer prepared in Manufacturing Example 5, a lithography test was carried out in the same manner as in Example 22.

[Reference Example 2] Formation of an Organic Anti-Reflective Coating Layer

Except for using 1.95 weight % of the isocyanurate compound prepared in Manufacturing Example 1 and 5.5 weight % of adhesive strength-enhancing polymer prepared in Manufacturing Example 5, a lithography test was carried out in the same manner as in Example 22.

[Reference Example 3] Formation of an Organic Anti-Reflective Coating Layer

Except for using 0.5 weight % of the isocyanurate compound prepared in Manufacturing Example 1 and 1.95 weight % of adhesive strength-enhancing polymer prepared in Manufacturing Example 5, a lithography test was carried out in the same manner as in Example 22.

[Reference Example 4] Formation of an Organic Anti-Reflective Coating Layer

Except for using 10.5 weight % of the isocyanurate compound prepared in Manufacturing Example 1 and 1.95 weight % of adhesive strength-enhancing polymer prepared in Manufacturing Example 5, a lithography test was carried out in the same manner as in Example 22.

The lithography test results of the organic anti-reflective coating layers prepared in Example 22 and Reference Examples 1 to 4 are shown in FIGS. 3 and 4 to 7, respectively. If the amount of the polymer in composition for forming the organic anti-reflective coating layer is too small (Reference Example 1, FIG. 4), the adhesion of the photoresist to the organic anti-reflective coating layer (PR) is lowered, and if the amount of the polymer is too large (Reference Example 2, FIG. 5), the adhesion of the organic anti-reflective coating layer film is good, but under-cut phenomenon occurs in the pattern profile. If the amount of the isocyanurate compound is too small (Reference Example 3, FIG. 6), the photoresist pattern with under-cut and standing-wave may be formed and if the amount of the isocyanurate compound is too large (Reference Example 4, FIG. 7), a photoresist pattern of standing-wave is observed, and the adhesion also is not good. This means that the process yield can be lowered when the amount of polymer and isocyanurate in the composition for forming the organic anti-reflective coating layer is too small or too large. When a composition for forming an organic anti-reflective coating layer containing proper amount of components is used (Example 22), a good lithography test result can be obtained (see FIG. 3).

The invention claimed is:

1. A composition for forming an organic anti-reflective coating layer comprising:
   an isocyanurate compound containing at least one moiety which is represented by following Formula 2;
   a polymer represented by following Formula 3; and
   an organic solvent for dissolving the above-mentioned components,

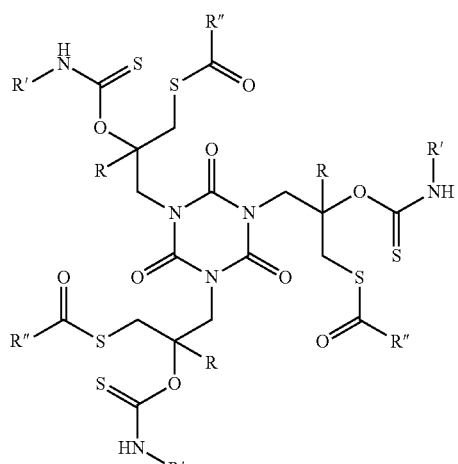

[Formula 2]

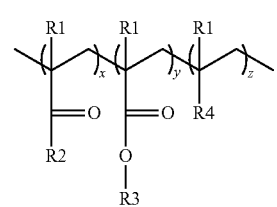

[Formula 3]

in Formula 2, R is independently a hydrogen atom or a methyl group, R' is independently a chain or cyclic saturated or unsaturated hydrocarbyl group of 1 to 15 carbon atoms containing 0 to 6 of hetero atoms, and R" is independently a chain or cyclic saturated or unsaturated hydrocarbyl group of 1 to 15 carbon atoms containing 0 to 8 of hetero atoms, and two or more moieties represented by the formula 2 are connected through R', In Formula 3, $R_1$ is independently a hydrogen or a methyl group (—$CH_3$), $R_2$ is a hydroxyl group (—OH) or an alkoxyl group of 1 to 5 carbon atoms containing 0 to 2 hydroxyl groups, $R_3$ is a chain or cyclic saturated or unsaturated hydrocarbyl group of 3 to 15 carbon atoms containing 0 to 2 hetero atoms, $R_4$ is an aryl group of 5 to 15 carbon atoms containing 0 to 3 of hetero atoms, x, y and z each is the mole % of each repeating unit constituting the polymer, x is 40 to 70 mole %, y is 5 to 25 mole % and z is 15 to 45 mole %.

2. The composition for forming an organic anti-reflective coating layer of claim 1, wherein the amount of the isocyanurate compound is 1 to 10 weight %, the amount of the polymer is 0.1 to 5 weight % and the amount of the organic solvent is 85 to 98.9 weight %.

3. The composition for forming an organic anti-reflective coating layer of claim 1, further comprising: 0.01 to 0.4 weight % of a crosslinking agent for crosslinking the isocyanurate compound; and 0.02 to 0.5 weight % of an acid generator for promoting the crosslinking reaction of the isocyanurate compound and for supplying acids to a lower part of a photoresist.

4. The composition for forming an organic anti-reflective coating layer of claim 1, wherein R' is independently an alkyl group of 1 to 10 carbon atoms containing 0 to 2 of hetero atoms, R" is independently (i) an alkyl group of 1 to 10 carbon atoms containing 0 to 2 of hetero atoms, or (ii) a cycloalkyl group, an aryl group or a heterocyclic group of 4 to 10 carbon atoms containing 0 to 2 hetero atoms, $R_2$ is an alkoxy group of 1 to 3 carbon atoms containing 0 to 2 hydroxyl groups, $R_3$ is an alkyl group or cycloalkyl group of 3 to 12 carbon atoms containing 0 to 2 hydroxyl groups, or a heterocyclic group of 3 to 12 carbon atoms containing 1 to 2 oxygen atoms, and $R_4$ is an aryl group of 6 to 12 carbon atoms containing 0 to 2 oxygen atoms.

5. The composition for forming an organic anti-reflective coating layer of claim 1, wherein the weight average molecular weight of the polymer is 3,000 to 10,000.

6. The composition for forming an organic anti-reflective coating layer of claim 1, wherein the isocyanurate compound represented by the Formula 2 is a compound containing repeating units represented by the following formulas 2a to 2h, and is selected from a group consisting of

[Formula 2a]
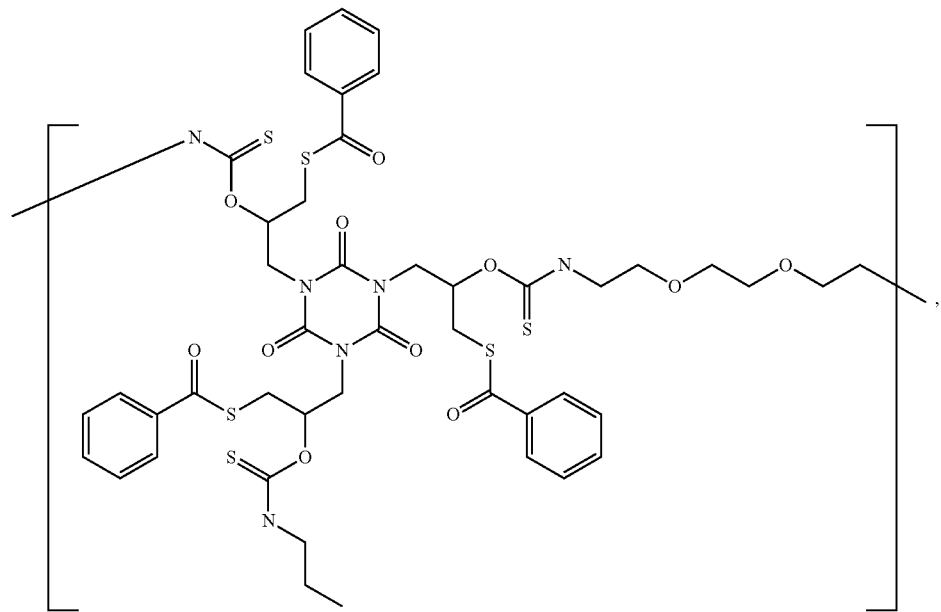
[Formula 2b]
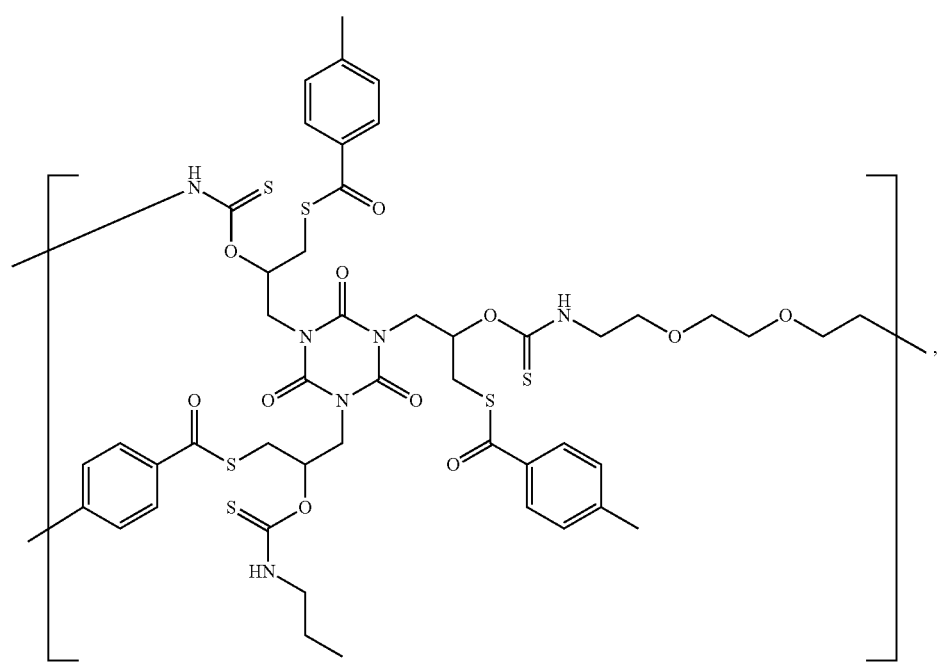

[Formula 2c]
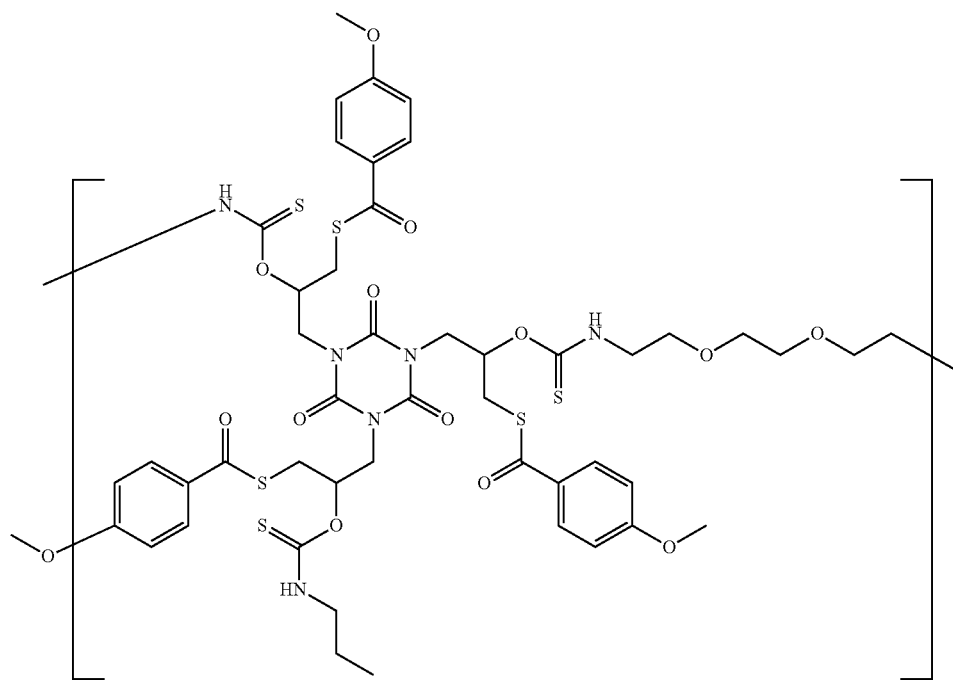
[Formula 2d]
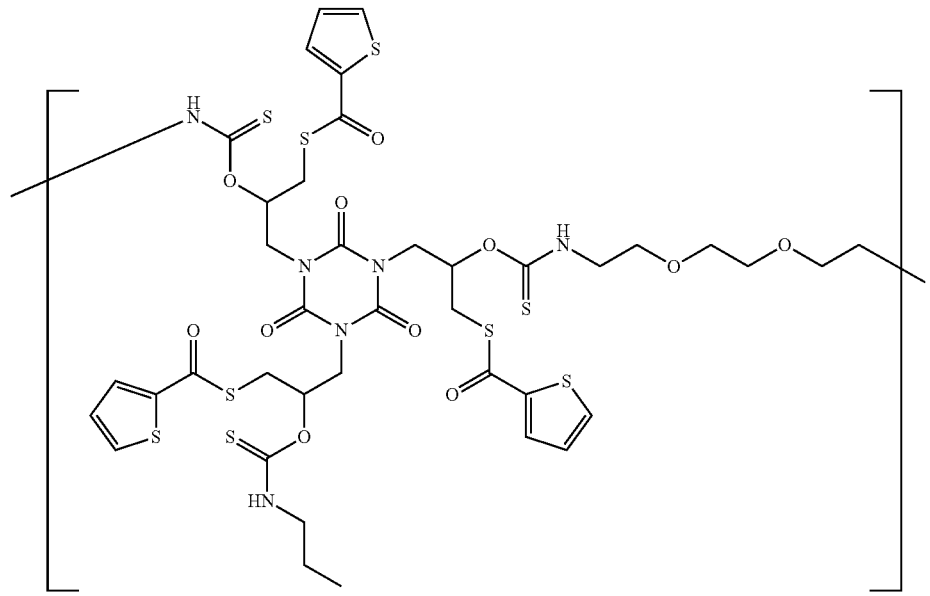

[Formula 2e]
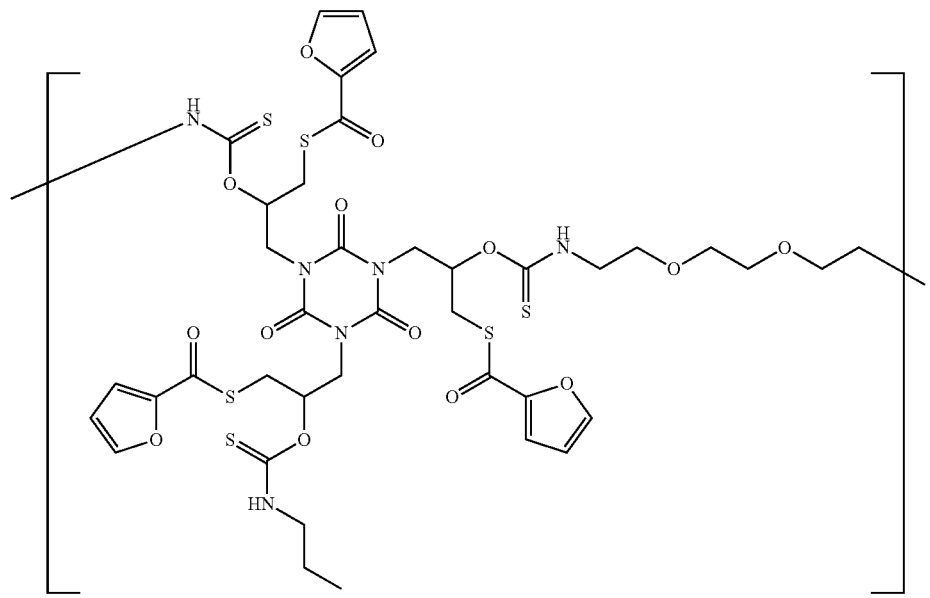
[Formula 2f]
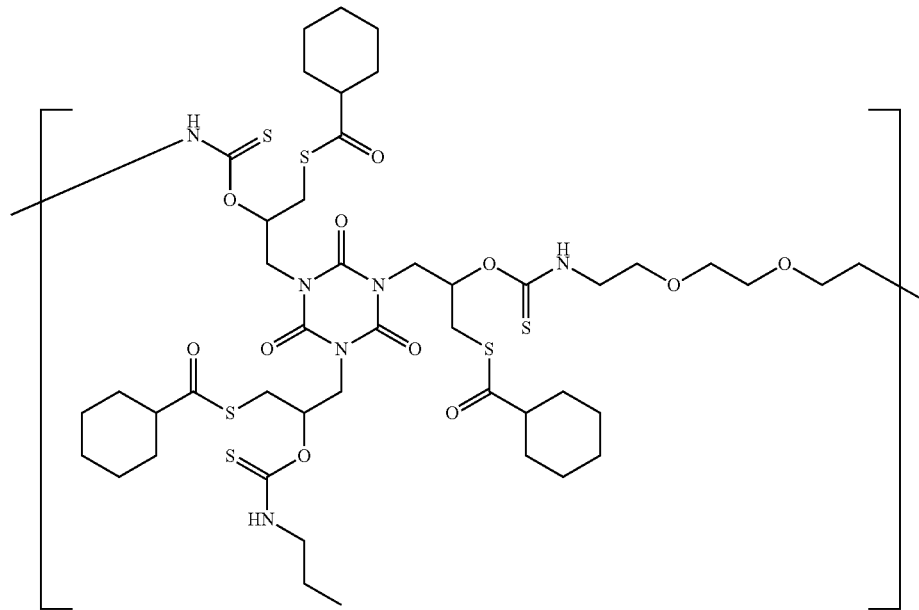

[Formula 2g]
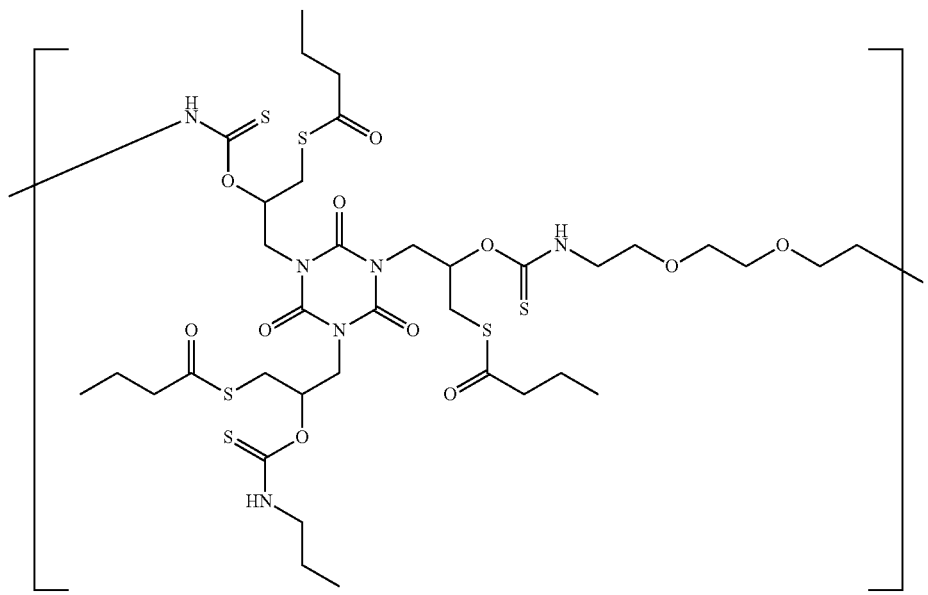
[Formula 2h]
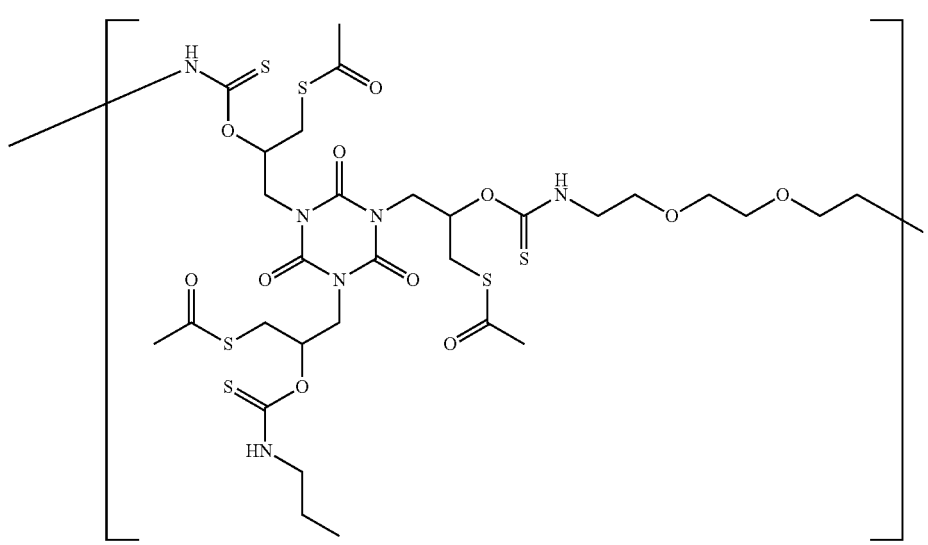

and mixture thereof, and the polymer represented by Formula 3 is selected from a group consisting of

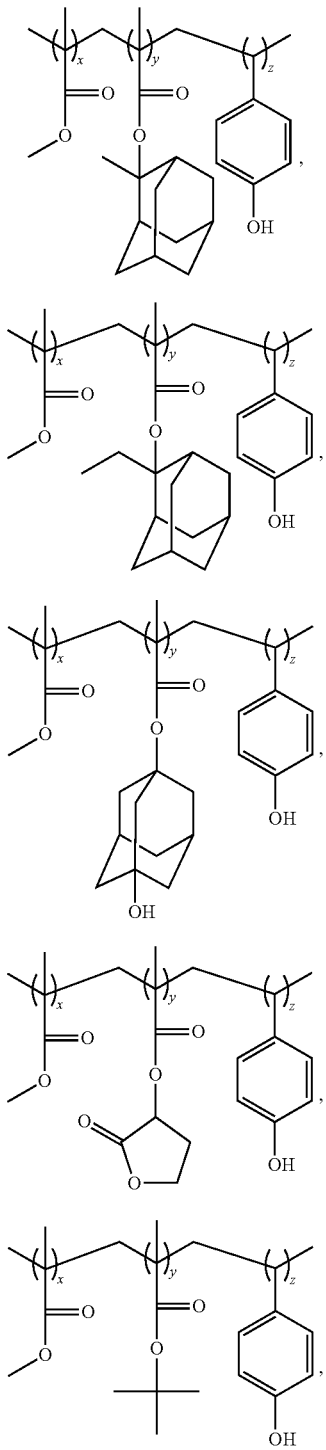

[Formula 3a]
[Formula 3b]
[Formula 3c]
[Formula 3d]
[Formula 3e]

-continued

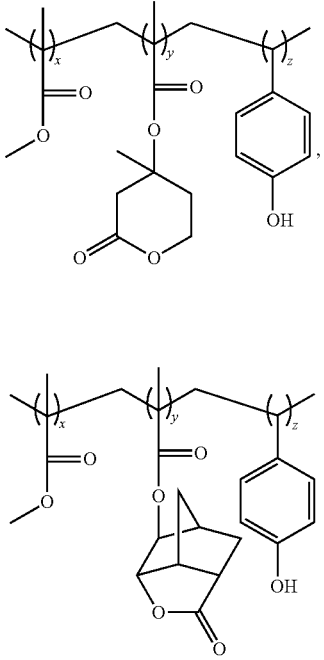

[Formula 3f]
[Formula 3g]

(in Formulas 3a to 3g, x, y and z are the same as defined in Formula 3) and mixture thereof.

7. The composition for forming an organic anti-reflective coating layer of claim 1, wherein the organic solvent is selected from a group of cyclohexanone, cyclopentanone, butyrolactone, dimethylacetamide, dimethylformamide, dimethylsulfoxide, N-methyl pyrrolidone (NMP), tetrahydro furfural alcohol, propylene glycol monomethyl ether (PGME), propylene glycol monomethyl ether acetate (PGMEA), ethyl lactate, mixtures thereof.

8. A method for forming an organic anti-reflective coating layer comprising of: coating the composition for forming an organic anti-reflective coating layer of claim 1 on an etching layer; and crosslinking the composition for forming an organic anti-reflective coating layer which is coated.

9. The method for forming an organic anti-reflective coating layer of claim 8, wherein the amount of the isocyanurate compound is 1 to 10 weight %, the amount of the polymer is 0.1 to 5 weight % and the amount of the organic solvent is 85 to 98.9 weight %.

10. The method for forming an organic anti-reflective coating layer of claim 8, further comprising: 0.01 to 0.4 weight % of a crosslinking agent for crosslinking the isocyanurate compound; and 0.02 to 0.5 weight % of an acid generator for promoting the crosslinking reaction of the isocyanurate compound and for supplying acids to a lower part of a photoresist.

* * * * *